United States Patent
Ishikawa et al.

(10) Patent No.: US 7,194,362 B2
(45) Date of Patent: Mar. 20, 2007

(54) SWITCHING CIRCUIT AND INDIVIDUAL VOLTMETER APPARATUS

(75) Inventors: Satoshi Ishikawa, Shizuoka (JP); Kouichi Yamamoto, Shizuoka (JP)

(73) Assignee: Yazaki Corporation, Tokyo (JP)

(*) Notice: Subject to any disclaimer, the term of this patent is extended or adjusted under 35 U.S.C. 154(b) by 0 days.

(21) Appl. No.: 11/085,196

(22) Filed: Mar. 22, 2005

(65) Prior Publication Data

US 2005/0206386 A1 Sep. 22, 2005

(30) Foreign Application Priority Data

Mar. 22, 2004 (JP) ............... 2004-082612

(51) Int. Cl.
G01R 15/00 (2006.01)
G01R 19/00 (2006.01)
G05F 1/00 (2006.01)

(52) U.S. Cl. .................. 702/57; 702/64; 323/282

(58) Field of Classification Search .......... 702/57, 702/64, 65; 323/282, 288
See application file for complete search history.

(56) References Cited

U.S. PATENT DOCUMENTS

2005/0088158 A1* 4/2005 Horiguchi et al. .......... 323/282

FOREIGN PATENT DOCUMENTS

| JP | H11-248755 | 9/1999 |
| JP | H11-248757 | 9/1999 |
| JP | 2002-156392 | 5/2002 |

* cited by examiner

*Primary Examiner*—Michael Nghiem
*Assistant Examiner*—Meagan S Walling
(74) *Attorney, Agent, or Firm*—Finnegan, Henderson, Farabow, Garrett & Dunner, L.L.P.

(57) ABSTRACT

It is an object to provide an individual voltmeter apparatus utilizing a switching circuit which suppresses the variation of the consumption power of the unit cell of a set of batteries. The power supply of a first current path $2m1$ and a second current path $2m2$ of a level shift circuit $2m$ is between the unit cell $Vm+1$ and $V1$, and between the unit cell $Vm+1$ and one lower rank cell $Vm$, respectively. The same current, which responds to all semiconductor switches, flows in the first current path $2m1$. In the second current path $2m2$, a larger current is provided to the second current path in which the semiconductor switch is connected to the higher rank unit cell.

8 Claims, 3 Drawing Sheets

SWITCHING CIRCUIT AND INDIVIDUAL VOLTMETER APPARATUS

BACKGROUND OF THE INVENTION

1. Field of the Invention

The present invention relates to a switching circuit and an individual voltmeter. More specifically, this invention relates to a switching circuit which connects both ends of a unit cell connected in series with other unit cell to a capacitor sequentially and relates to an individual voltmeter apparatus having the switching circuit.

2. Description of the Related Art

As a conventional switching circuit, a flying capacitor circuit as shown in FIG. 3 is proposed (for example, JP,H11-248755,A and JP,2002-156392,A).

The flying capacitor circuit is provided with a capacitor and a plurality of selector switches S1 to Sn+1 which connect both ends of each unit cell among V1 to Vn to both ends of the capacitor sequentially, for a plurality of unit cells V1 to Vn which are connected in series. In FIG. 3, each unit cell of V1 to Vn constitutes a battery.

The (n+1) selector switches S1 to Sn+1 are provided for n unit cells V1 to Vn. A negative side of the unit cell V1 and a positive side of the unit cell V2 connected to the negative side of the unit cell V1 are connected to the capacitor C through a common relay switch S2. As shown in FIG. 4, it is also proposed a flying capacitor circuit that both ends of each unit cell of V1 to Vn are provided with two selector switches S1 to S2$n$. See, JP,H11-248757,A.

The flying capacitor circuit is used, for example, for voltmeter apparatus. A voltage of each unit cell is detected by measuring the voltage of the capacitor C when both ends of each unit cell of V1 to Vn are connected by switches.

A relay switch has been used conventionally for the selector switch. However, the relay switch is inferior in respect of cost, size, durability, response speed, etc. compared with semiconductor switches, such as FET. Thus, a semiconductor switch may be used for the selector switch.

The semiconductor switch, which is connected to a higher rank unit cell in the flying capacitor circuit, has a higher source potential. Accordingly, it is necessary to apply a high gate voltage to the gate of a semiconductor switch which is connected to a higher rank unit cell. Therefore, when the gate voltage is supplied by a power supply of a set of batteries, the gate voltage of the semiconductor switch connected to the higher rank unit cell is applied by a power supply between the higher rank unit cell and the lowest unit cell V1.

Referring to FIG. 3, each selector switch of S1, S2, ... and Sn needs a gate voltage for a power supply of a unit cell V1, between V2 and V1, ..., and between Vn and V1, respectively.

Then, a lower unit cell consumes more current to generate a gate voltage and it causes a problem of a variation of electric power consumption in each unit cell.

SUMMARY OF THE INVENTION

The present invention is to provide a switching circuit which suppresses a variation of electric power consumption of a unit cell and to provide an individual voltmeter apparatus utilizing the switching circuit.

According to a first aspect of the invention, we provide a switching circuit having a capacitor and a plurality of semiconductor switches to connect both ends of each unit cell of a set of batteries, which is formed with a plurality of unit cells connected in series, to the capacitor sequentially. It further includes a logic circuit to output a control signal to order ON and OFF of the plurality of semiconductor switches, and a plurality of level shift circuits, which is provided each for the plurality of the semiconductor switches, to output a level shift of the control signal to a gate of the corresponding semiconductor switch, wherein the level shift circuit corresponding to the semiconductor switch connected to a higher rank unit cell have a power supply between a first unit cell of the higher rank and a lowest unit cell and have a higher current.

Preferably, an individual voltmeter has the switching circuit described herein and a measurement means to measure the voltage of both ends of the capacitor.

According to an aspect of the present disclosure, the level shift circuit corresponding to the semiconductor switch connected to a higher rank unit cell utilizes a power supply between the first unit cell of the higher rank and the lowest unit cell, and has a higher consumption current for the lower unit cell when the level shift of the control signal is made. However, when the current flowing through the level shift circuit corresponding to the semiconductor switch connected to the higher rank unit cell is increased, the variation of the consumption current of the level shift circuit of the unit cell is suppressed.

Preferably, the first unit cell, which is the power supply of the level shift circuit corresponding to the semiconductor switch connected to the higher rank unit cell, increases the rank by a prescribed number.

Preferably, the plurality of level shift circuits have a first current path, the power supply thereof being between the first unit cell and the lowest unit cell, and a second current path, the power supply thereof being between the first unit cell and a second unit cell the rank of which is lower by the prescribed number than the first unit cell.

The power supply of the first current path and the second current path in the level shift circuit is between the first unit cell and the lowest unit cell and between the first unit cell and the second unit cell below the prescribed number, respectively. Thereby, the second current path does not use the lower rank unit cell than the second unit cell as the power supply. Due to the first current path, the lower rank unit cell consumes more current. However, the second current path balances the variation of the consumption power of the unit cell by making the consumption current of the unit cell equal.

Preferably, the first current path has a first shift semiconductor switch which turns ON responding to the output of a control signal, and the second current path has a second shift semiconductor switch, which turns ON when a current flows in the first current path.

The first shift semiconductor switch turns ON when the control signal outputs, and a current flows in the first current path. Thereby, when the second shift semiconductor switch turns ON, a current flows in the second current path. Then, a simple structure utilizing the first and second shift semiconductor switches can perform level shift of the control signal.

Preferably, a same current corresponding to all the semiconductor switches flows in the first current path, and the second current path has a higher current for the semiconductor switch connected to the higher rank unit cell.

The same current corresponding to all semiconductor switches flows in the first current path. The higher current flows in the second current path for the semiconductor switch connected to the higher rank unit cell. Thereby, the same current flows in all first current paths and it is possible to figure out the extent of the current to flow the second current path so that the consumption current of each unit cell of the level shift circuit becomes equal.

Preferably, both ends of each unit cell are connected to the capacitor sequentially so that the power consumption of each unit cell of the plurality of level shift circuits is same.

Thereby, the consumption power of each unit cell for the plurality of level shifts becomes equal.

DESCRIPTION OF THE PREFERRED EMBODIMENTS

Figure 1:
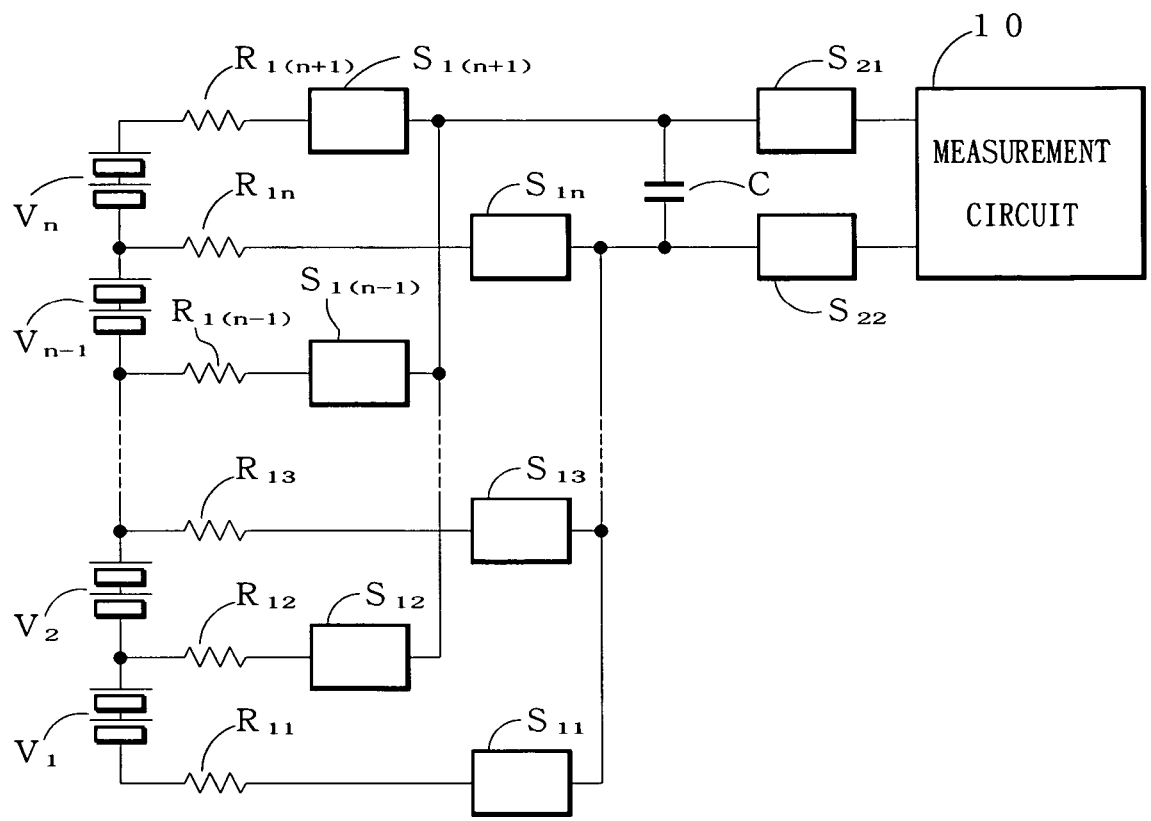
FIG. 1 is an embodiment of a voltmeter apparatus incorporated a switching circuit of the present invention.

Referring to the figures, a switching circuit and voltmeter apparatus of the present invention are described. FIG. 1 is an embodiment of the voltmeter apparatus incorporating the switching circuit of the present invention. As shown in FIG. 1, the voltmeter circuit is provided with one capacitor C for a set of batteries in which n unit cells V1 to Vn, each unit cell having two batteries, are connected in series.

The voltmeter circuit is provided with semiconductor switches S11 to S1 (n+1) which connect both ends of the unit cell V1 to Vn to both ends of the capacitor C sequentially, and is provided with resistances R11 to R1 (n+1) which are connected to the semiconductor switches S11 to S1 (n+1) in series. The (n+1) semiconductor switches of S11 to S1 (n+1) are provided for n unit cells V1 to Vn. The switching circuit has the semiconductor switches S11 to S1 (n+1) and the capacitor C. Both ends of the capacitor are connected to a measurement circuit 10, which measures a charge voltage of the capacitor C, through a measurement switch S21 and S22.

Explained below is the operation of the voltmeter circuit incorporating the switching circuit. A logic circuit (not shown) turns ON the semiconductor switches S11 and S12 to connect both ends of the unit cell V1 to both ends of the capacitor C. Thereby, the charge voltage of the capacitor C becomes a value corresponding to the voltage of the unit cell V1. Next, the logic circuit turns OFF the semiconductor switches S11 and S12 to disconnect the unit cell V1 from the capacitor C, and turns ON the measurement switches S21 and S22 for the measurement circuit 10 to measure the charge voltage of the capacitor C. The measurement circuit 10 can measure, insulated from the set of batteries, the both ends voltage of the unit cell V1 by measuring the charge voltage of the capacitor C.

Then, the logic circuit turns ON the semiconductor switches S12 and S13 to connect both ends of the unit cell V2 to both ends of the capacitor C. Thus, the logic circuit controls ON/OFF of the semiconductor switches S11 to S1(n+1) and the measurement switches S21 and S22. Thereby, both ends of each unit cell V1 to Vn are connected to the capacitor C sequentially and the charge voltage of the capacitor, which corresponds to the voltage of the connected unit cell V1 to Vn, is measured by the measurement circuit 10.

Figure 2:
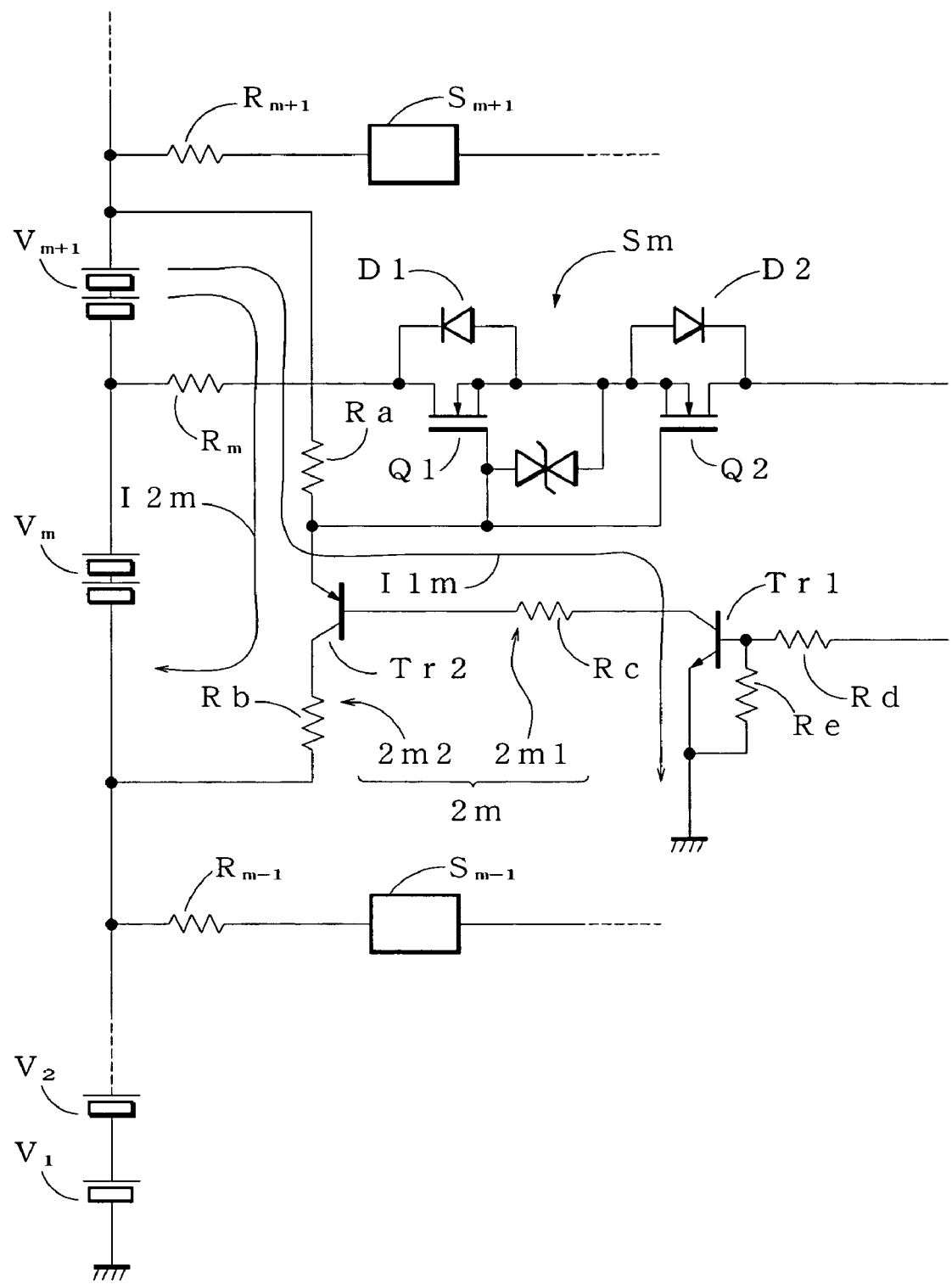
FIG. 2 is a circuit diagram showing an arbitrary semiconductor switch Sm and a level shift circuit 2m corresponding to the semiconductor switch Sm among semiconductor switches S12 to S1n which constitute a voltmeter apparatus shown in FIG. 1.
Figure 3:
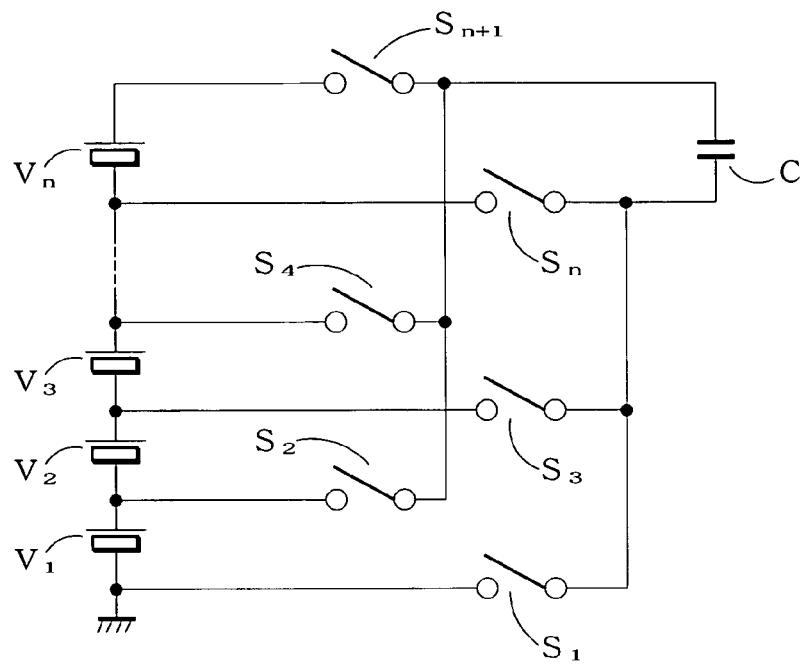
FIG. 3 is a circuit diagram showing an example of a conventional flying capacitor circuit.
Figure 4:
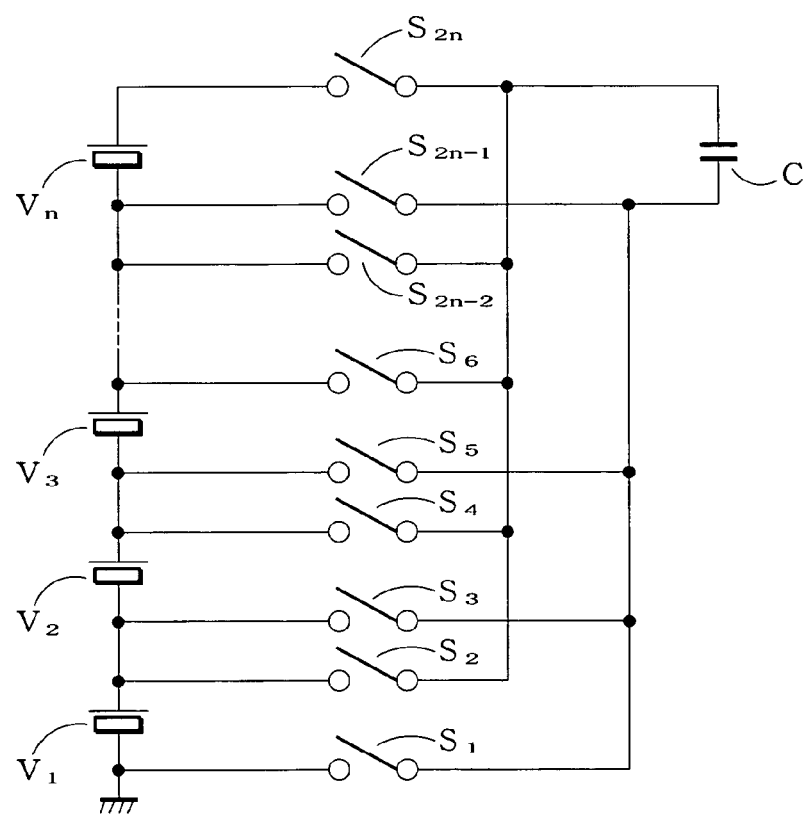
FIG. 4 is a circuit diagram showing an example of a conventional flying capacitor circuit.

Referring to FIG. 2, the semiconductor switches S12 to S1n and a level shift circuit, which generates a gate voltage to each semiconductor switch S12 to S1n, are described in detail. FIG. 2 is a circuit diagram showing an arbitrary semiconductor switch Sm among the semiconductor switches S12 to S1n, and a level shift circuit 2m corresponding to the arbitrary switch Sm.

As shown in FIG. 2, the semiconductor switch Sm is provided with two N-channel field-effect transistors (FET) Q1 and Q2, which are connected in series, where the direction of the source to drain current through each transistor is opposite to each other. Parasitic diodes D1 and D2, which are generated between source and drain of each FET-Q1 and FET-Q2, have a reverse forward direction with respect to each other.

Since the forward direction of the parasitic diodes D1 and D2, which are generated between source and drain of each FET-Q1 and FET-Q2, are reversed with respect to each other, the current flow through the parasitic diode is prevented when the semiconductor switch is OFF.

The gate of FET-Q1 and FET-Q2 is connected to one end of the collector of a transistor Tr2 (a second shift semiconductor switch) and a resistance Ra. The other end of the resistance Ra is connected to the positive side of a unit cell Vm+1. The emitter of the transistor Tr2 is connected to the negative side of the unit cell Vm through a resistance Rb.

The base of the transistor Tr2 is connected to the collector of a transistor Tr1 (a first shift semiconductor switch) through a resistance Rc. The emitter of the transistor Tr1 is connected to the ground. The base is connected to the logic circuit (not shown) through a resistance Rd and to the emitter through a resistance Re.

Thereby, when a control signal of 5V is supplied to the base of the transistor Tr1 from the logic circuit of 5V system, a current flows through Rd and Re. At this moment, a voltage occurs at the resistance Re. It causes a bias between the emitter and the base of the transistor Tr1 so that the transistor Tr1 turns ON.

When the transistor Tr1 turns ON, a current I1m flows through a resistance Ra, the collector of the transistor Tr2, a resistance Rc, the collector and emitter of the transistor Tr1 in turn. Thereby, the voltage generated at the resistance Rc gives a bias between the emitter and base of the transistor Tr2 and turns ON the transistor Tr2. When the transistor Tr2 turns ON, a current I2m flows through the resistance Ra, the collector and emitter of the transistor Tr2, and the resistance Rb in turn.

When the transistors Tr1 and Tr2 turn ON, a voltage is applied to the FET-Q1 and FET-Q2, which is the summation of the voltage Vm−1 to V1 unit cell and the divided voltage of the Vm+1 plus Vm by the resistance Ra and Rb. Thereby, a bias voltage higher than the source is applied to the gates of the FET-Q1 and FET-Q2 and turns ON the FET-Q1 and FET-Q2.

As depicted in FIG. 2, the level shift circuit 2m has a first current path 2m1 and a second current path 2m2. The first current path 2m1 is a current flow of I1m through the resistance Ra, the collector and base of the transistor Tr2, the resistance Rc, and the collector and emitter of the transistor Tr1 in turn by a power supply between the unit cell Vm+1 (a first unit cell) and the unit cell V1 (the lowest unit cell). The second current path 2m2 is a current flow of I2m through the resistance Ra, the collector and emitter of the transistor Tr2, and the resistance Rb in turn by a power supply between the unit cell Vm+1 and the one-lower unit cell Vm (a second unit cell).

The first current path 2m1 utilizes a higher rank unit cell for the power supply as the semiconductor switch is connected to a higher rank unit cell. In the level shift circuit 2(m+1) of the case of a higher rank semiconductor switch Sm+1 than the switch Sm, a first current path 2(m+1)1 utilizes the power supply between a unit cell Vm+2, which is higher rank than the unit cell Vm+1, and the unit cell V1.

A P-channel FET is utilized for a semiconductor switch Sn+1 connected to the positive side of the highest rank unit cell Vn. The level shift circuit 2(n+1) corresponding to the semiconductor switch Sn+1 utilizes a power supply with a voltage between the voltages of unit cell Vn and V1, and supplies a division of the power supply to the gate of the semiconductor switch Sn+1. An N-channel FET is utilized for a semiconductor switch S1 connected to the negative side of the lowest rank unit cell V1. The level shift circuit 21 corresponding to the semiconductor switch S1 utilizes the power supply of the unit cell V1 only, and supplies a division of the power supply to the gate of the semiconductor switch S1.

The level shift circuit 2(n+1) and 21 corresponding to the highest rank unit cell Vn and the lowest rank unit cell V1 is provided with the first current path to flow a current I1(n+1) and I11, but is not provided with the second current path.

Therefore, the consumption current IC to ICn of each unit cell V1 to Vn consumed by the level shift circuit 21 to 2(n+1) corresponding to the semiconductor switch S1 to Sn+1 is as follows.

$$IC1=I11+\ldots+I1(n+1)+I22$$

$$IC2=I12+\ldots+I1(n+1)+I22+I23$$

$$\ldots$$

$$ICm=I1m+\ldots+I1(n+1)+I2m+I2(m+1)$$

$$\ldots$$

$$IC(n-1)=I1(n-1)+I1n+I1(n+1)+I2(n-1)+I2n$$

$$ICn=I1n+I1(n+1)+I2n$$

The electric current I11, I12, ..., I1n, and I1(n+1) flowing each first current path 211 to 2(n+1)1 of the level shift 21 to 2(n+1) is set to be equal to $I\alpha$ (namely I11=I12= ... =I1n=I1(n+1)=$I\alpha$). The consumption current IC1 to ICn becomes as the following.

$$IC1=(n+1)*I\alpha+I22$$

$$IC2=n*I\alpha+I22+I23$$

$$\ldots$$

$$ICm=(n-m+2)*I\alpha+I2m+I2(m+1)$$

$$\ldots$$

$$IC(n-1)=3*I\alpha+I2(n-1)+I2n$$

$$ICn=2*I\alpha+I2n$$

As obviously from the above equation, the lower unit cell has a higher current consumed by the first current path 211 to 2(n+1)1. Here, the consumption current of the second current path 212 to 2(n+1)2 of the higher rank unit cell is increased to balance the difference of the first current path 211 to 2(n+1)1. In order to make the consumption current IC1 to ICn of each unit cell V1 to Vn equal, the consumption current I22 to I2n of the second current path 212 to 2(n+1)2 is set to be $$I22=I\beta \text{ (arbitrary constant)}$$

$$I23=I\alpha \text{ (from IC1=IC2)}$$

$$\ldots$$

$$I2m=I\alpha+I2(m-2) \text{ [from } i(m-2)=i(m-1)]$$

$$\ldots$$

$$I2n=I\alpha+I2(n-2)$$

As seen above, the power supply of the first current path 2m1 and the second current path 2m2 in the arbitrary level shift circuit 2m is between the unit cell Vm+1 and V1, and between the unit cell Vm+1 and Vm, respectively. The second current path 2m2 does not use the lower rank unit cell than the unit cell Vm as the power supply. Due to the first current paths 211 to 2(n+1)1, the lower rank unit cell consumes more current. However, the second current paths 222 to 2n2 balance the variation of the consumption power of the unit cell of V1 to Vn by making the consumption current IC1 to ICn of the unit cell of V1 to Vn equal.

Since the same current $I\alpha$ flows in all the first current paths 211 to 2(n+1)1, it is easy to figure out the extent of the current in the second current paths 222 to 2n2 to make the consumption currents IC1 to ICn of the unit cells V1 to Vn of the level shift circuit 21 to 2(n+1) all equal. Thus, the design of the level shift circuits 21 to 2(n+1) becomes easy and a cost reduction can be made.

When the control signal outputs, the transistor Tr1 turns ON and a current flows in the first current path 2m1. Thereby, the transistor Tr2 turns ON and a current flows also in the second current path 2m2. Therefore, a simple structure using the transistor Tr1 and Tr2 makes a level shift of the control signal.

In the above embodiment, the current of the first current path is set equal in each level shift circuit and the consumption current of the second current path is set higher at the higher rank so as to set the consumption currents IC1 to ICn of the unit cells V1 to Vn equal. It is also possible to set the consumption currents IC1 to ICn equal by adjusting the consumption current of the second current path in the case that the current of the first current path increases with higher rank.

In the above embodiment, the second current path is provided to set each consumption current of IC1 to ICn equal. It is also appreciated that the consumption current of the first current path increases with the rank without the second current path. In this case, it is not possible to set each consumption current of IC1 to ICn equal. However, the variation of the consumption currents IC1 to ICn in the level shift circuit can be reduced compared with all currents of the first current path equal.

What is claimed is:

1. A switching circuit having a capacitor and a plurality of semiconductor switches to connect both ends of each of a plurality of unit cells of a set of batteries formed with the plurality of unit cells connected in series to the capacitor sequentially, further comprising a plurality of level shift circuits, wherein a level shift circuit is provided for each of the plurality of semiconductor switches, to output a level shift of the control signal to a gate of the corresponding semiconductor switch, wherein the level shift circuit corresponding to the semiconductor switch connected to a higher rank unit cell has a power supply between a first unit cell and a lowest unit cell, and has a higher current, and wherein the plurality of level shift circuits have a first current path, the power supply thereof being between the first unit cell and the lowest unit cell, and a second current path, the power supply thereof being between the first unit cell and a second unit cell with a prescribed lower number rank.

2. The switching circuit according to claim 1, further comprising a logic circuit to output a control signal to order ON and OFF of the plurality of semiconductor switches.

3. The switching circuit according to claim 2, wherein the first current path has a first shift semiconductor switch which turns ON responding to the output of a control signal, and the second current path has a second shift semiconductor switch which turns ON when a current flows in the first current path.

4. The switching circuit according to claim 2, wherein a same current corresponding to all the semiconductor switches flows in the first current path, and the second current path has a higher current for the semiconductor switch connected to the higher rank unit cell.

5. An individual voltmeter comprising the switching circuit according to any of claims 3, 4, 1, or 2, and further including a measurement means to measure the voltage of both ends of the capacitor.

6. The individual voltmeter according to claim 5, wherein both ends of each unit cell are connected to the capacitor sequentially so that the power consumption of each unit cell of the plurality of level shift circuits is same.

7. A switching circuit having a capacitor and a plurality of semiconductor switches that successively connect both ends of each of a plurality of unit cells connected in series to the capacitor, further comprising a plurality of level shift circuits, wherein a level shift circuit is provided for each of the plurality of semiconductor switches and each of the plurality of level shift circuits provides a level shift of the control signal to a gate of a corresponding semiconductor switch, wherein the level shift circuit corresponding to a semiconductor switch connected to a higher rank unit cell has a power supply between a first unit cell and a lowest unit cell, and wherein each of the plurality of level shift circuits has a first current path and a second current path different from the first current path.

8. The switching circuit according to claim 7, wherein the level shift circuit corresponding to a semiconductor switch connected to a higher rank unit cell has a higher current.

* * * * *